United States Patent [19]

Iijima

[11] Patent Number: 5,621,600
[45] Date of Patent: Apr. 15, 1997

[54] INDUCTIVE SHORT FINDER

[76] Inventor: Akira Iijima, 20909 Norwalk Bl #24, Lakewood, Calif. 90715

[21] Appl. No.: 189,892

[22] Filed: Feb. 1, 1994

Related U.S. Application Data

[63] Continuation-in-part of Ser. No. 45,941, Apr. 12, 1993, abandoned.

[51] Int. Cl.$^6$ ........................................ H02H 3/00
[52] U.S. Cl. ........................ 361/93; 361/58; 361/115
[58] Field of Search .................... 361/93, 80, 81, 361/85, 78, 79, 58, 115; 324/52, 51

[56] References Cited

U.S. PATENT DOCUMENTS 4,518,911  5/1985  Cass ................................ 324/52

Primary Examiner—Jeffrey A. Gaffin
Assistant Examiner—Stephen Jackson
Attorney, Agent, or Firm—Gerald W. Maliszewski

[57] ABSTRACT

A portable apparatus to test an automobile wiring harness for the location of a short in one of the wires. A transmitter is used to apply a low frequency, low duty cycle, pulsed signal to the wire under test. A receiver, with an inductive sensor, detects magnetic fields generated by the pulsed signal current flow between the transmitter and the short. The receiver generates a humanly discernable signal in response to the detected magnetic field. The operator finds the short by following the detected magnetic field of the signal pulse through the wire under test. By noting the location of a dramatic discontinuity in magnetic field strength, the operator can gauge the location of the short in the wire. The low voltage amplitude, low duty cycle, pulse signal allows the transmitter to be operated with a small battery. The low power signals also provide safety to circuits connected to the wire. The low frequency and power of the pulsed signal minimizes coupling between wires. The substantially contained magnetic field allows the operator of the portable receiver unit to pinpoint the location of the short.

18 Claims, 4 Drawing Sheets

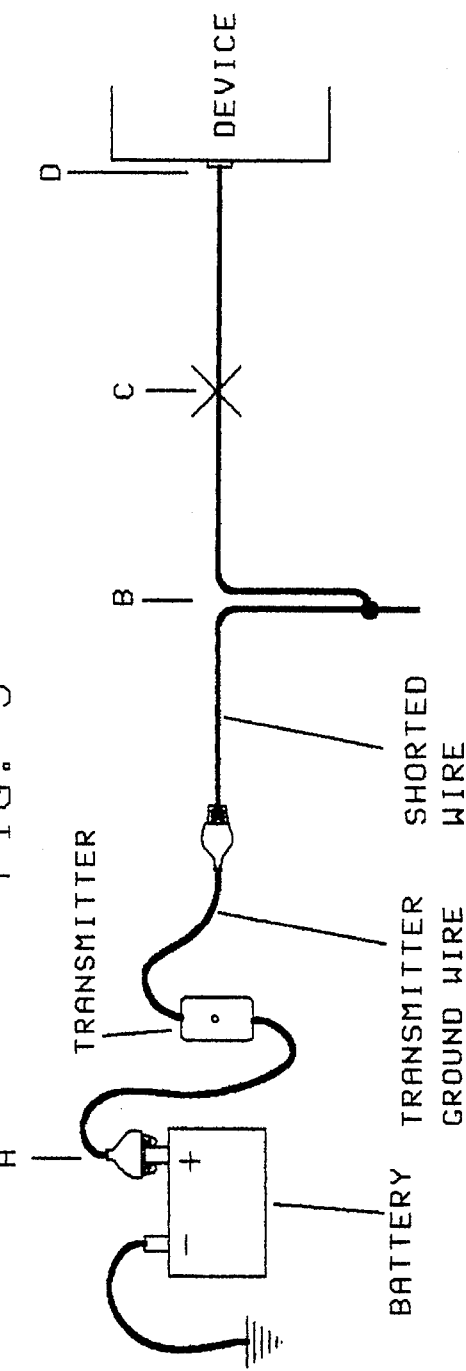
FIG. 3
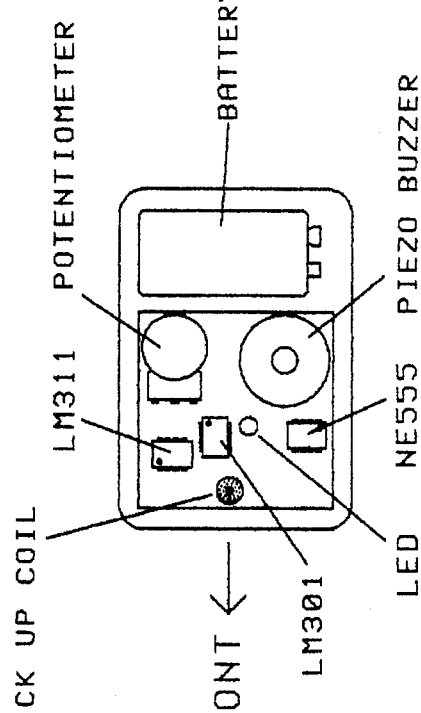
FIG. 4 FRONT
INVENTOR
AKIRA IIJIMA

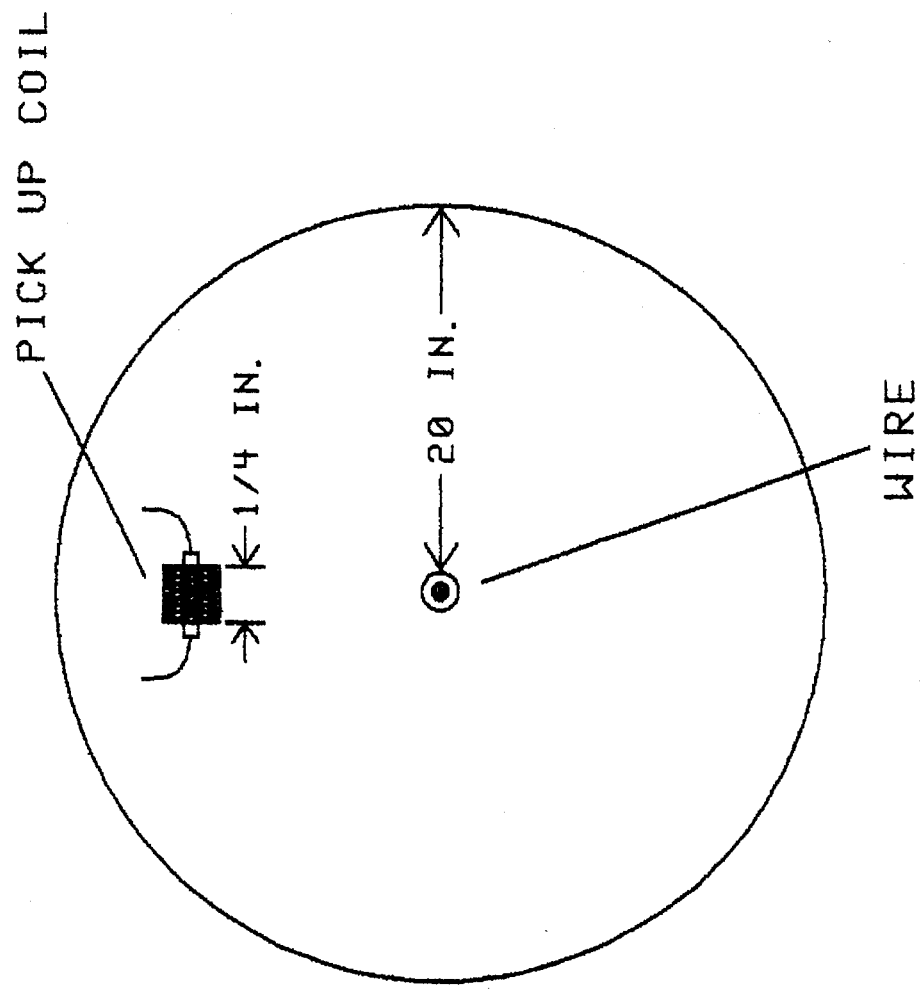

INDUCTIVE SHORT FINDER

This application is a Continuation in part of Ser. No. 08/045,941 filed Apr. 12, 1993 now abandoned.

FIELD OF THE INVENTION

This invention relates to cable and wire harness testing, specifically to an improved method of testing a wire to locate the precise location of a low impedance path to ground or to another wire.

BACKGROUND OF THE INVENTION

Many failures associated with electrical systems are due to problems with the wiring. A common wire failing is the "short", or unintended low impedance path. A wire can become shorted when the insulation surrounding the wire becomes chaffed or broken, allowing the wire to make contact with another conductive surface such as a chassis or another wire.

Previous Approaches to the Problem

Shorted wires can be difficult to detect, especially if the wire is not accessible, or covered by other wires in a wire harness. An ohmmeter, used to measure the resistance between points, can often be used to detect if a wire is shorted, but is little help in detecting the exact location of the short.

A common technique used to trace the path of a wire involves the application of an audio range a.c. signal to a wire or wire pair by a signal generator. An inductive type sensor may then be used, with a speaker or meter, to aid the location process. The sensor is susceptible to magnetic fields created by the current flow of the audio signal in the wire. The strength of the tone heard on the speaker is an indicator of current flow. An operator is able to trace the path of the current flow from the generator, and, therefore, the path of the wire. When the operator no longer hears the tone, the operator has either moved the sensor too far from the wire, or the wire has ceased to conduct current.

This inductive sensor locating technique usually uses audio range, or higher, frequency a.c. signals. The stray capacitive coupling between wires, and objects in close proximity, allows the transmitted a.c. signals to be conducted from the intended wire to other wires, shields, and objects in the vicinity. As a result the signal is initially located with greater ease. General location is important when cables cannot be seen. However, when precision is required in finding the exact location of a short, or the intended signal carrier in a wire bundle, then low frequency signals would be more desirable.

The inductive sensor locating technique is often used to trace extremely long cables, or cables hidden from view. Transmitters used in such applications generate powerful a.c. signals. Powerful transmitters must be inherently large if large batteries are used as a power source. Alternately, a powerful transmitter must be attached to an outside power source. In either case a powerful transmitter tends to limit the portability of the unit. Powerful transmitters also create a concern for the safety of the electronic circuitry attached to the wire under test. High voltage, high duty cycle, signals may require that all circuitry be disconnected from the wire under test before turning on the transmitter. Due to coupling between wires, prudent testing may require that circuitry attached to adjacent wires also be disconnected.

The receiver used for the general location of long runs of cable may use large inductors as sensors to increase sensitivity. Likewise, the electronic circuitry needed to increase the sensitivity of the unit to the transmitted signal, and to render the received signal into indicators that are useful to the operator, can be extensive. All these factors limit the portability of the unit and prevent the receivers from being used in confined spaces.

Objects of the Present Invention

In light of the above mentioned problems, it is an object of the present invention to provide a small and portable apparatus to use in finding the location of shorts in a wire harness. It is also an object to provide a transmitter and receiver unit small enough to be used in confined areas. Yet another object of the present invention is to make the receiver simple to use, and small enough to be held and manipulated in one hand. It is yet another object of the present invention to transmit and receive low duty cycle signals to save transmitter battery power. It is another object to provide a transmitter that can operate for prolonged periods of time on a small internal battery. Still another object of the present invention is to transmit and receive low frequency, low power, signals to allow the more precise location of wiring shorts. Another object of the present invention is to create a low power transmit signal that is less likely to damage circuitry attached or coupled to the wire carrying the signal. It is an object of the present invention to generate and receive signals with a minimum of circuitry to reduce design complexity, overall size, parts cost, assembly costs, and manufacturing test costs. Another object of the present invention is to provide a device that uses common parts to make the price economical.

SUMMARY OF THE INVENTION

A cable test apparatus for detecting shorts is provided, consisting of a transmitter and a receiver section. A low frequency, low duty cycle signal is applied directly to the suspect wire by the transmitter. The transmitter may be either externally or internally powered by a d.c voltage. The receiver consists of an inductive probe to detect the magnetic field created by low frequency signal current flow in the wire. The receiver contains a small battery for power and an indicator to notify the operator of a detected magnetic field. The receiver is manipulated along the suspect wire, moving away from the transmitter. If the wire is shorted, then at some point along the wire the receiver will cease to detect the field. The point at which the field can no longer be detected is the location of the short.

Sensitivity Control

Depending on the application, some wires may be located in large wire bundles, or located in hard to reach areas. To balance the need for general or preliminary location, with the precision location of shorts, both the transmitter power and the receiver sensitivity can be made adjustable to allow the operator a variety of transmitter power and receiver sensitivity options. Multiple transmitter current levels also provide the operator with options to balance the concerns of receiver sensitivity, protection of the circuits under test, and power consumption.

Precision Location

The low frequency signal applied to the wire by the transmitter, and detected by the receiver, allows the operator to pinpoint the location of the shorts within inches. The frequency of the transmitted signal reduces the likelihood of capacitive coupling between wires. The transmitter signal is also a low peak power, low duty cycle signal. These factors of low power and frequency tend to create small fields contained to the vicinity of the wire under test. These contained fields allow the receiver to discriminate field strength in close proximity of the signal carrying wire. In this manner a short can be accurately found.

Portable Operation

Another advantage of the low power transmitter is its ability to operate for extended periods of time with a small internally located battery, when external power is not available. The low duty cycle of the transmitted signal enables the power circuitry for relatively short amounts of time, which reduces overall power consumption. Since power consumption is low, a small battery can be used for d.c. power. The small size of the transmitter allows it to be placed in a confined area and set up in a short amount of time. Another advantage of the low power transmitter is the safety it affords electronic circuitry. The low voltages and limited duty cycle of the signal put a minimum amount of energy into circuits that may be attached to the wire under test, or to wires coupled to the wire under test.

Automobile Troubleshooting

The present invention is ideally suited for troubleshooting the wiring of automobiles. The use of microprocessors and electronics has grown extensively in the last few years. Complicated diagnostic equipment exists for some troubleshooting functions, but little test equipment exists that allow an automotive technician to rapidly locate a short in the wiring. The present invention can be set up in seconds, and does not require extensive training to use. Because of its size, the receiver an be manipulated almost anywhere a wire can go.

Further advantages of the present invention will become apparent from a consideration of the drawings and ensuing description.

BRIEF DESCRIPTION OF THE DRAWINGS

The novel features of this invention, as well the structure and operation of the invention itself, will be best understood from the accompanying drawings. The accompanying description and these drawings present similar reference characters for similar parts, and in which.

Figure 1:
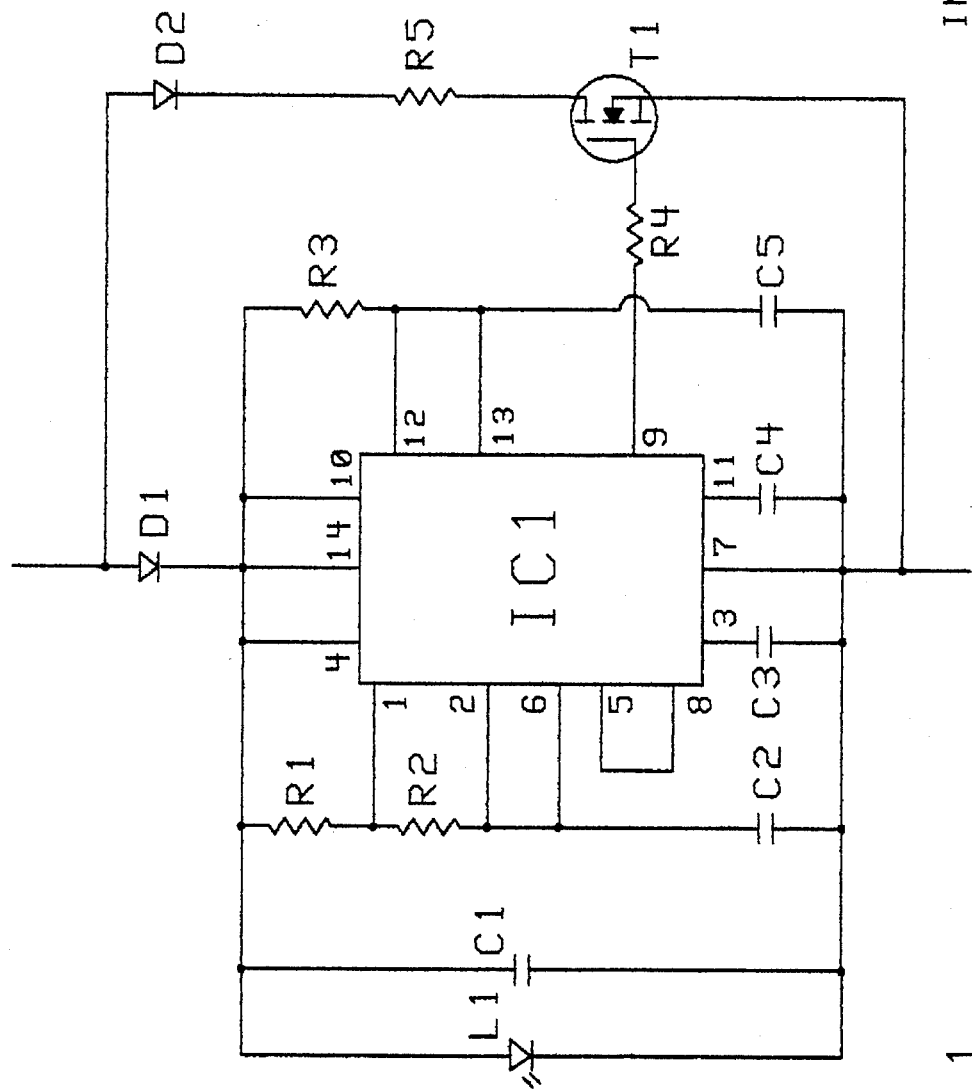
FIG. 1 depicts the approach of the present invention to detecting the location of a short in a conductive wire.

| REFERENCE NUMERALS IN DRAWINGS |
| --- |
| 1 transmitter |
| 3 power supply |
| 5 battery clip |
| 7 receiver |
| 9 transmitter input current lead |
| 11 transmitter output current lead |
| 13 test wire clip |

| REFERENCE NUMERALS IN DRAWINGS -continued |
| --- |
| 14 wire under test |
| 15 pulse generator |
| 17 transistor |
| 19 inductor |
| 21 voltage comparator |
| 23 monostable multivibrator |
| 25 operator alert indicator |
| 27 light emitting diode (LED) |
| 29 capacitor |
| 31 resistor |
| 33 resistor |
| 35 capacitor |
| 37 capacitor |
| 39 diode |
| 41 556 timer integrated circuit |
| 43 capacitor |
| 45 resistor |
| 47 resistor |
| 49 capacitor |
| 51 diode |
| 53 resistor |
| 55 field effect transistor (FET) |
| 57 diode |
| 59 diode |
| 61 resistor |
| 63 resistor |
| 65 capacitor |
| 67 potentiometer |
| 69 capacitor |
| 71 resistor |
| 73 resistor |
| 75 voltage comparator |
| 77 diode |
| 79 capacitor |
| 81 resistor |
| 83 operational amplifier |
| 85 resistor |
| 87 resistor |
| 89 capacitor |
| 91 555 timer integrated circuit |
| 93 capacitor |
| 95 piezo buzzer |
| 97 LED |
| 99 resistor |
| 101 capacitor |

DESCRIPTION OF PREFERRED EMBODIMENTS

FIG. 1, General Approach of the Present Invention

FIG. 1 is a simplified block diagram approach of the present invention to detecting shorts in a wire. A transmitter input current lead 9 is connected to a power supply or battery 3 with a battery terminal clip 5. Alternately, a battery internal to transmitter 1 can be used. A transmitter output current lead 11 is attached to a wire under test 14 with a clip 13. The wire under test 14 runs from point A to point C, with a short to ground at point B. Magnetic fields are created by the flow of transmitter 1 generated signal current through wire 14 between points A and B. A receiver 7 is moved along wire 14 starting at point A. When receiver 7 no longer detects a magnetic field from wire 14, it has moved past the short, point B. Measurement of magnetic field discontinuities allow the operator of receiver 7 to locate the position of the short, point B, in the wire under test 14.

Figure 2:
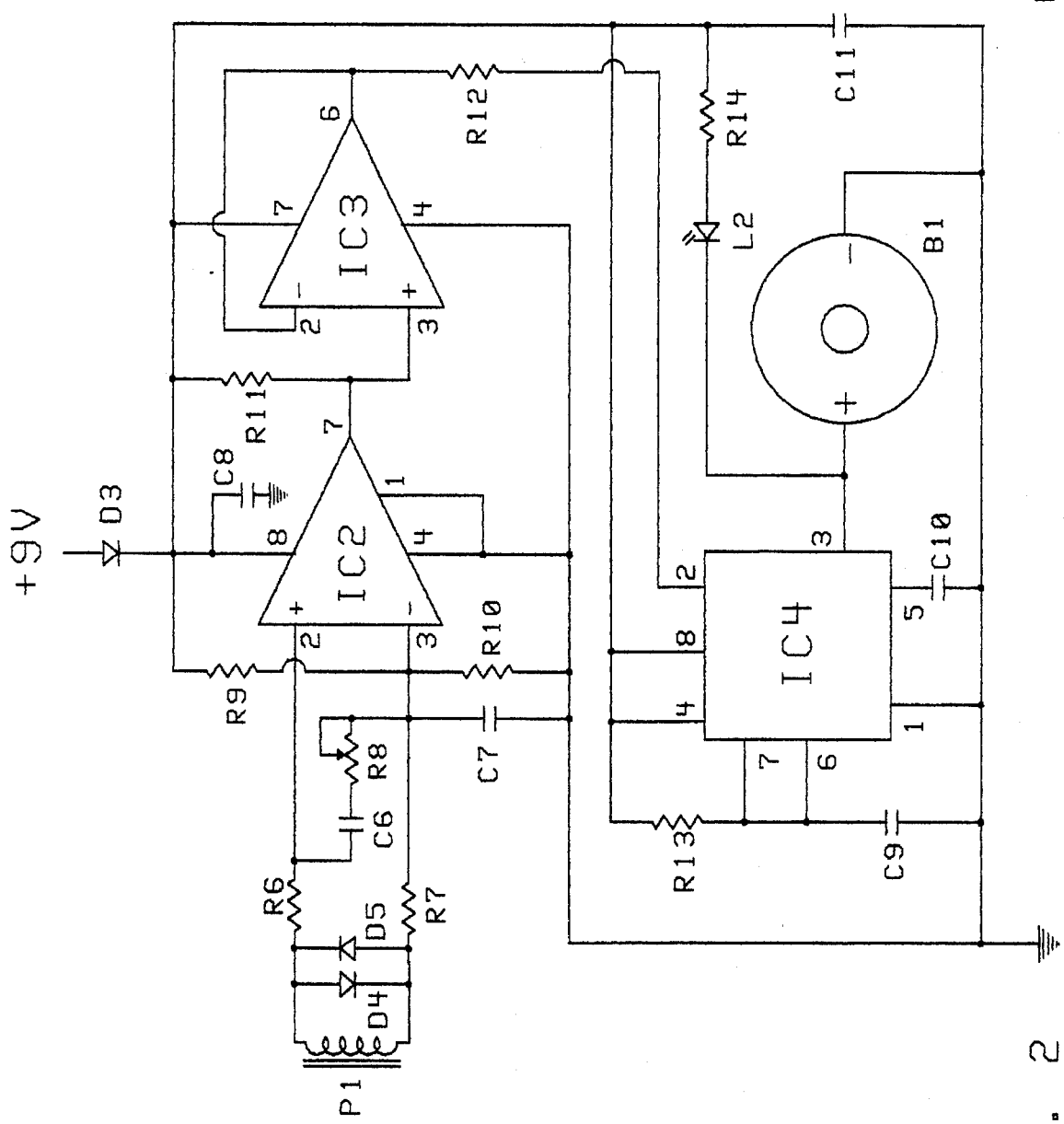
FIG. 2 is a simplified block diagram of the transmitter.
Figure 1:
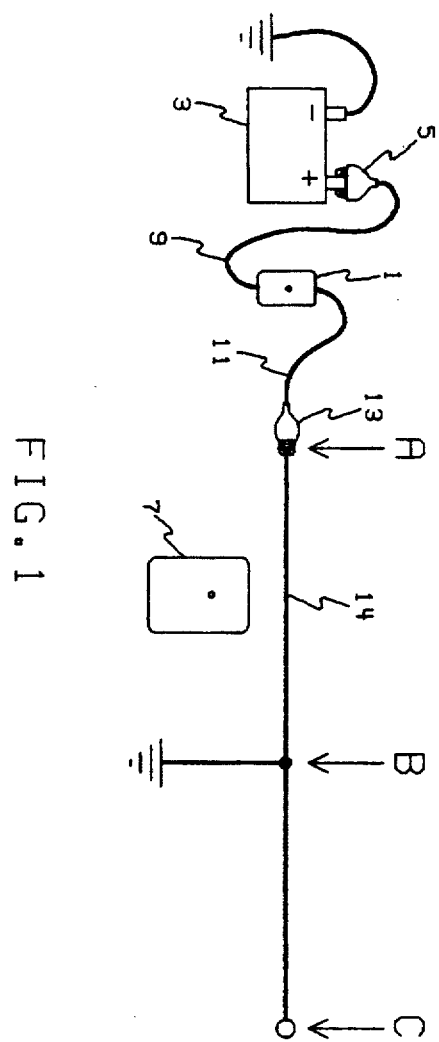
Figure 2:
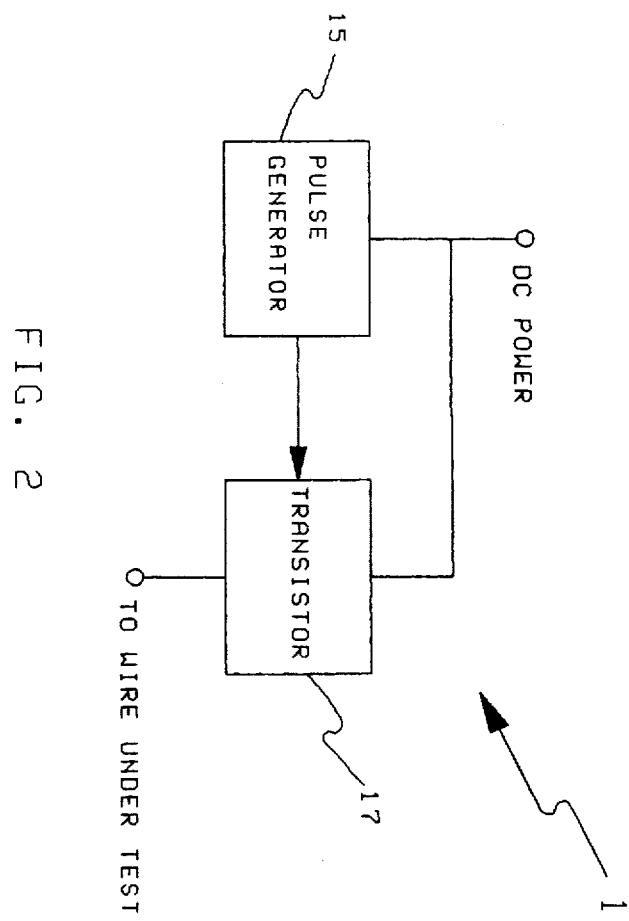

FIG. 2, Block Diagram of the Transmitter

FIG. 2 is a simplified block diagram of the transmitter and generally designated 1. Transmitter 1 is used to apply a signal to the wire under test 14. Transmitter 1 is powered with a d.c. source such as a battery co-located in the transmitter, or by an external supply. While FIG. 2 depicts transmitter 1 as being powered directly from a d.c. power source, one skilled in the art can appreciate that voltage regulators may be used to power transmitter 1 from a variety of external voltage sources.

A pulse generator 15 consists of electrical circuits configured to oscillate at a periodic frequency with a specific duty cycle. Pulse generator 15 provides the control current to the base of a transistor 17. Transistor 17 gates the amount of current flow from the power source to the wire under test 14. Transistor 17 conducts current during the period of time when pulse generator 15 creates a high voltage signal. While the pulse generator 15 has been depicted as the sole means of controlling transistor 17, one skilled in the art can appreciate that resistor and capacitor networks between pulse generator 15 and transistor 17 can also be used to control transistor 17. Alternately, a resistor in series with the transistor 17, between the voltage source and wire under test can be used to control current flow through the transistor 17.

A current indicator can also be added to transmitter 1 to gauge the flow of current from transmitter 1 into the wire under test 14. This feature would be useful for quickly determining the impedance of the short. A current indicator would also be useful to an operator seeking to minimize transmitter power consumption.

Figure 3:
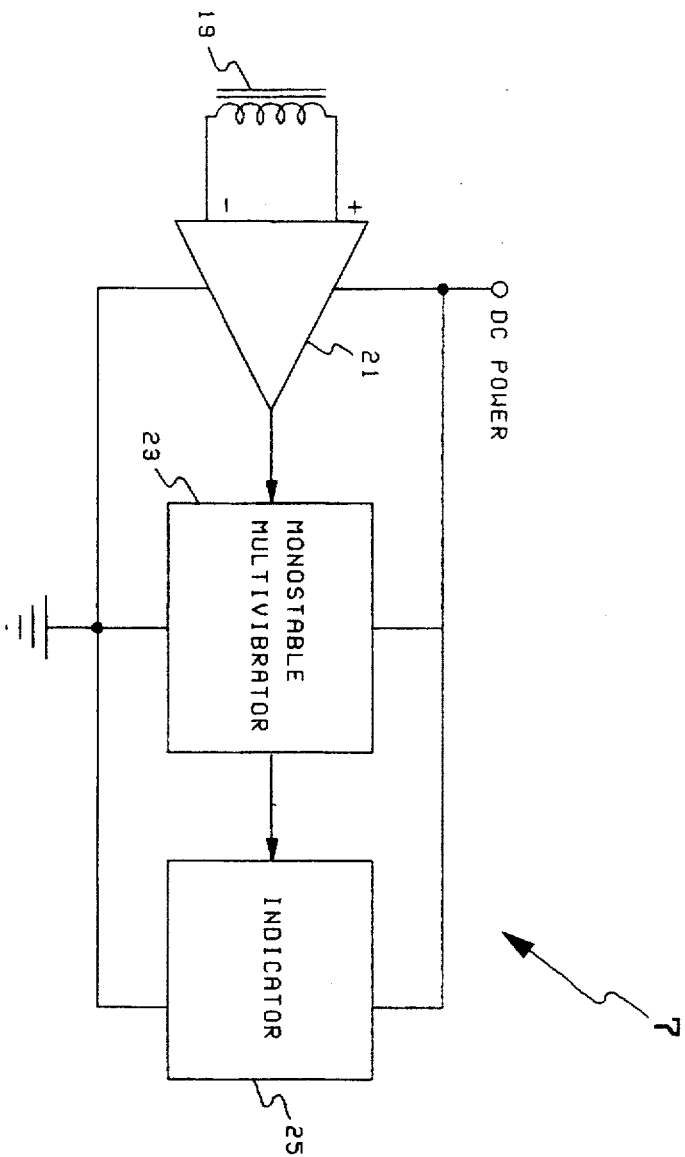
FIG. 3 is a simplified block diagram of the receiver.

FIG. 3, Block Diagram of the Receiver

FIG. 3 is a simplified block diagram of the receiver used to detect signal current flow in the wire under test 14, and is generally designated 7. A d.c. power source supplies current to a voltage comparator 21, a monostable multivibrator 23, and an indicator 25. The flow of the signal current created by transmitter 1 creates a magnetic field in the wire under test 14 that is detected by an inductor 19. The magnetic field generated in the wire under test 14, in turn induces a voltage potential across inductor 19. This potential, or difference in voltage, is detected by voltage comparator 21. Voltage potentials above a threshold level cause voltage comparator 21 to trigger, or create a large output signal corresponding in frequency and duty cycle to the triggering signal. While no means is depicted in FIG. 3 to control the threshold voltage level to voltage comparator 21, one skilled in the art can appreciate that various resistor and capacitor networks can be created, to set either a fixed threshold level, or to make one adjustable by the operator of the device.

The sensitivity of receiver 7 to detected magnetic fields can also be controlled with a selectable inductor 19. Inductors constructed with different cores, different gauge wires, or a different number of turns around the core all have different susceptibilities to magnetic fields.

Still referring to FIG. 3, the output of voltage comparator 21 acts as a trigger signal to monostable multivibrator 23. The frequency at which monostable multivibrator 23 operates is dependent upon the frequency detected by voltage comparator 21 and, so ultimately on, the signal generated by transmitter 1. Monostable multivibrator 23, when triggered by voltage comparator 21, generates a duty cycle suitable to enable the indicator 25. Indicator 25 creates a signal discernable to the operator of receiver 7. One skilled in the art can appreciate that the duty cycle of monostable multivibrator can be manipulated to optimize the performance of the specific indicator 25.

Figure 4:
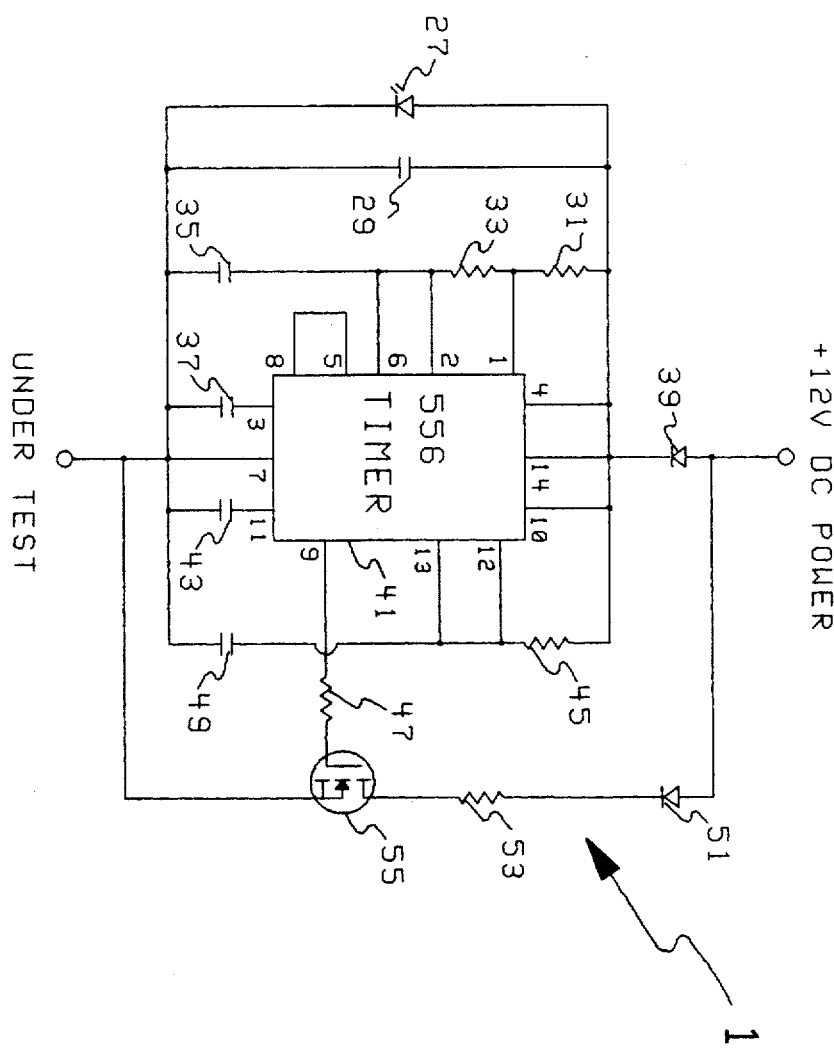
FIG. 4 is a schematic of the preferred embodiment of the transmitter.

FIG. 4, Detailed Schematic of the Transmitter

FIG. 4 is a detailed schematic of the preferred embodiment of transmitter 1. A 556 timer 41 consists of two 555 timers. One of the 555 timers (pins 1–6), along with resistors 31 and 33, and capacitors 35 and 37, operate as an astable multivibrator whose configuration is well known in the art. Resistors 31, 33, and capacitor 35 are configured in the present invention to create a periodic frequency of approximately 0.5 Hz with a duty cycle of approximately 5%. The second 555 timer (pins 8–13), along with resistor 45, and capacitors 43 and 49, operates as a monostable multivibrator whose configuration is well known in the art. The monostable multivibrator is triggered by the output signal of the astable oscillator.

Still referring to FIG. 4, the output of the monostable multivibrator (pin 9) provides a positive voltage signal corresponding to the 5% duty cycle established by the astable oscillator. Resistor 47 acts to condition the output of the monostable multivibrator for the purpose of controlling the gate voltage to a FET 55. FET 55 conducts current when the gate voltage is positive. Resistor 53 acts to limit the current flow to approximately 1 ampere when FET 55 conducts. Alternately, resistor 53 could be selected to limit the current flow to other peak current values, such as 3 amperes.

Still referring to FIG. 4, LED 27 acts as an indicator which is lit when transmitter 1 is powered. Capacitor 29 conditions the voltage to 556 timer 41. Diodes 39 and 51 regulate current flow and provide protection in case the leads to transmitter 1 are reversed, or a negative voltage power supply is used. Transmitter 1 may be powered by either an external source, or by a battery co-located with transmitter 1 circuitry. A 12 volt, 2.5 amp hour battery is suitable for this application.

Figure 5:
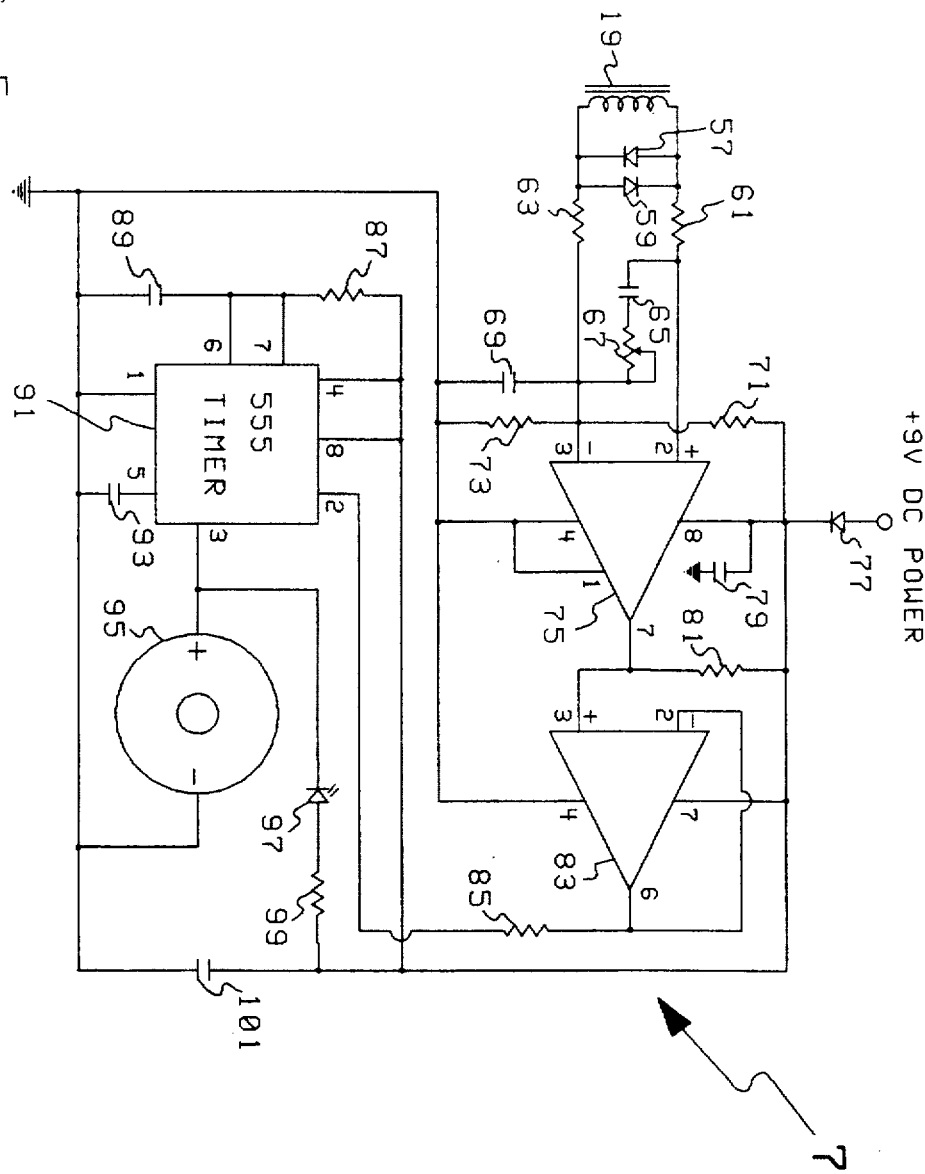
FIG. 5 is a schematic of the preferred embodiment of the receiver.

FIG. 5, Detailed Schematic of the Receiver

FIG. 5 is a detailed schematic of the preferred embodiment of receiver 7. Inductor 19 is used to detect the magnetic field created by transmitter 1 signal current flow in the wire under test. Diodes 57 and 59 regulate the voltage potential across the inductor to a maximum of a diode drop. Resistors 71, 73, and capacitor 69 function to set a reference voltage for a voltage comparator 75. Potentiometer 67 and capacitor 65 act to control the sensitivity of voltage comparator 75 by adjusting the impedance between voltage comparator 75 input ports.

Voltage comparator 75 acts to increase the gain of the relatively small voltage signal created across inductor 19 by a detected magnetic field. The output of voltage regulator 75 translates this small detected voltage pulses into pulse signal levels usable for interfacing to standard logic family integrated circuits. The output signal of voltage comparator 75 is connected to the input of an operational amplifier 83.

Still referring to FIG. 5, operational amplifier 83 functions as a non-inverting, gain of one, amplifier whose configuration is well known in the art. The signal delay provided by operational amplifier 83 provides greater circuit stability. Resistor 81 acts to adjust the d.c. bias on the output signal of operational amplifier 83 to properly interface with 555 timer 91. Resistor 85 acts to further condition the magnetic field trigger signal generated by operational amplifier 83.

555 timer 91, along with resistor 87, and capacitors 89 and 91, function as a monostable multivibrator whose configuration is well known in the art. The output of 555 timer 91, called the indicator control signal, is used to drive piezo buzzer 95 which creates an audible tone corresponding to a signal detected from the wire under test 14. 555 timer 91 also drives LED 97 which is normally on, and turns off when a signal is detected from the wire under test. Resistor 99 regulates the current flow through LED 97. Capacitor 101 conditions the voltage to LED 97. Capacitor 79 conditions the voltage to the voltage comparator 75, operational amplifier 83, and 555 timer 91. Diode 77 acts to prevent reverse current flow in case the d.c. power is applied incorrectly. Receiver 7 is powered by a battery co-located with receiver 7 circuitry.

OPERATION

Operation of the present invention will be discussed in terms of the embodiments shown in FIGS. 1, 4, and 5.

Apparatus Set Up

Operation of the present invention is initiated when a problem due to a short in the wiring between electrical assemblies is suspected. Referring to FIG. 1, the wire under test 14 is tested by detaching both ends (points A and C) of the wire from associated electrical circuits. Alternately, circuitry can remain attached to the wire under test 14 if the circuitry has a high impedance and is not susceptible to damage. Transmitter 1 is attached to one end of the wire 14 at point A. If the operator is working in the engine compartment of a car, the car battery 3 is available to power transmitter 1. If point A is located at some other point of the car, or associated with electrical assemblies where no external power supplies are available, then the internal battery of transmitter 1 may be used.

Transmitter Operation

Referring to FIG. 4, 556 timer 41 is configured as an oscillator with a frequency of 0.5 Hz and a duty cycle of 5%. 556 timer 41 generates a positive voltage associated with the 5% duty cycle. This positive voltage, in turn, enables FET 55 to conduct a peak current at a 5% duty cycle. This signal is conducted by transmitter output current lead 11.

Referring again to FIG. 1, if the wire is shorted, then the signal current generated by transmitter 1 will be conducted through transmitter output current lead 11, and through wire under test 14 to the point of the wire short, point B. Receiver 7, powered by an internal battery, is manipulated along the wire 14, starting at point A.

Receiver Operation

Referring to FIG. 5, inductor 19 acts as a sensor which is susceptible to the magnetic fields created by the flow of signal current in the wire under test 14. Detected fields above a threshold level cause voltage comparator 75 to trigger. This threshold level is controlled by potentiometer 67. Detected signals over the threshold level indirectly trigger 555 timer 91 through voltage comparator 75, and in turn, operational amplifier 83. 555 timer 91 is configured as a monostable multivibrator with a duty cycle of approximately one hundred microseconds. When triggered, 555 timer 93 causes piezo buzzer 95 to sound and LED 97 to flash. Referring again to FIG. 1, using the sight and sound indicators of receiver 7, an operator is alerted to the presence of detected magnetic fields. An operator can note discontinuities in the fields through these indicators, by moving receiver 7 along wire under test 14. By noting the point along wire 14 where the magnetic fields ceases, an operator can accurately gauge the location of the short.

Sensitivity Control

Technicians working in confined spaces, or with large wire bundles may adjust potentiometer 67 for maximum sensitivity to detect a signal at a convenient distance from the wire. Alternately, the technician may minimize receiver 7 sensitivity to move receiver 7 close enough to a wire harness to identify a specific wire. Similar sensitivity issues can be addressed by manipulating the current produced in the transmitted signal with different values of resistor 53. Alternately, inductor 19 can be selected by the operator to suit receiver 7 sensitivity requirements.

While the particular pulse detection cable test apparatus as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown, other than as described in the appended claims.

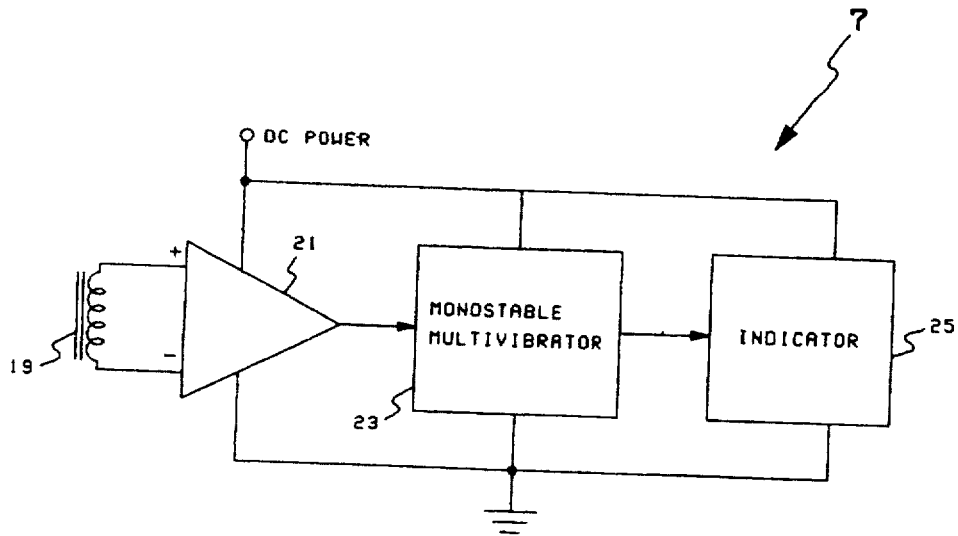

I claim:

1. A method for testing an electrical conductor to determine the precise location of a short comprising the steps of:
   (a) applying a very low duty cycle, extremely low frequency, low voltage, electrical pulse to the conductor, the applying of the pulse signal to the conductor includes the step of generating the pulse signal with a 556 timer integrated circuit;
   (b) inductively detecting the magnetic field generated by the electrical current flow of the pulse in the conductor, the inductive detecting of the magnetic field includes the step of coupling the detected magnetic field to the input of a voltage comparator to amplify the detected magnetic field;
   (c) enabling an indicator of the detected magnetic field, discernible to a human operator, the generation of the humanly discernible indicator includes the step of coupling the voltage comparator output to the input of a 555 timer integrated circuit, the 555 timer output signal controlling the indicator;
   (d) determining the point along the conductor where a change in the magnetic field is indicated; and
   (e) noting the location of the short in the conductor from the determination made in step (d).

2. An apparatus for detecting the location of a low impedance short in a conductive wire, comprising:
   (a) a very low duty cycle, sub-voice frequency, pulse transmitter, said transmitter further includes a transmitter input current lead, said input current lead to conduct d.c. source current from an external power supply to said transmitter;
   (b) a current control resistor to limit the pulse current amplitude of said transmitter;
   (c) a transmitter output current lead to conduct pulse current from said transmitter to the wire;
   (d) a low voltage battery, integral to said transmitter, to source d.c. current to said transmitter, thereby providing said transmitter with a d.c. current source alternative to said transmitter input current lead; and
   (e) a receiver, further comprising:
      (1) an inductive sensor to detect a magnetic field from the pulse current in the wire; and
      (2) an indicator coupled to said inductive sensor for alerting a human operator to the detected magnetic field, thereby allowing the operator to precisely locate the short in the wire by noting the position of said receiver relative to the wire as said indicator demonstrates a change in detectable magnetic field.

3. The apparatus of claim 2 wherein said transmitter further includes a voltage regulator integrated circuit integral to said transmitter, said voltage regulator to control the d.c. voltage level coupled into said transmitter through said input current lead, thereby allowing a plurality of external power supply voltage levels to source current to said transmitter.

4. The apparatus of claim 2 wherein said pulse current amplitude control resistor is a plurality of resistors for limiting the pulse current to a plurality of amplitudes.

5. The apparatus of claim 2 wherein said pulse transmitter further includes a pulse current meter for measuring the pulse current and displaying the measured value.

6. The apparatus of claim 2 wherein said transmitter includes a 556 timer integrated circuit to generate said transmitter pulse signal.

7. The apparatus of claim 6 wherein said inductive sensor is coupled to a potentiometer to adjust the impedance of said inductive sensor, thereby controlling the sensitivity of said inductive sensor to the detected magnetic field.

8. The apparatus of claim 7 wherein said inductive sensor is a plurality of inductive sensors for a plurality of detection sensitivities to the magnetic field.

9. The apparatus of claim 7 wherein said inductive sensor is further coupled to the input of a voltage comparator integrated circuit for amplification of the detected magnetic field.

10. The apparatus of claim 9 wherein a 555 timer integrated circuit is coupled to the output of said voltage comparator, for enabling said operator alert indicator.

11. An apparatus for the measurement of the location of a low impedance short in a conductive wire, comprising:

(a) a portable means for applying an extremely low duty cycle, below audio frequency, signal to said wire;

(b) a means for controlling the current amplitude of said signal application means;

(c) a low voltage means for powering said signal application means, said powering means integral to said signal application means;

(d) a portable means for detecting the magnetic field generated by the current flow of the signal through said wire; and (e) a means for indicating the detection of the magnetic field, thereby allowing the operator to note the position of said detecting means relative to said wire as said indicator means demonstrates a change in detectable magnetic field, and to so locate the short in said wire.

12. The apparatus of claim 11 wherein said magnetic field detecting means further includes a potentiometer for controlling the sensitivity of said detecting means to the magnetic field.

13. The apparatus of claim 11 wherein said magnetic field detecting means further includes an inductive sensor coupled to the input of a voltage comparator to amplify the detected magnetic field.

14. The apparatus of claim 13 wherein a 555 timer integrated circuit is coupled to the output of said voltage comparator to generate a signal for the enablement of said operator indication means.

15. The apparatus of claim 14 wherein said powering means further includes an alternate powering means, said alternate powering means is an input current lead for conducting current from an external power source to said signal application means.

16. The apparatus of claim 15 wherein said alternate powering means further includes a voltage regulator integrated circuit for controlling a d.c. voltage level coupled into said signal application means through said input current lead, thereby allowing said signal application means to be powered from a plurality of external source voltages.

17. The apparatus of claim 15 wherein said current amplitude control means is a plurality of resistors to control a plurality of current amplitudes.

18. The apparatus of claim 15 wherein a 556 timer integrated circuit controls the frequency and duty cycle of said signal application means.

* * * * *

UNITED STATES PATENT AND TRADEMARK OFFICE
CERTIFICATE OF CORRECTION

PATENT NO.   : 5,621,600

DATED       : April 15, 1997

INVENTOR(S) :. Akira Iijima

It is certified that error appears in the above-identified patent and that said Letters Patent is hereby corrected as shown below:

The Title page, showing an illustrative figure, should be deleted and substitute therefor the attached title page.

Delete drawing sheets 1-4, and substitute therefor the drawing sheets, consisting of Figs. 1-5, as shown on the attached pages.

Signed and Sealed this

Fourteenth Day of October, 1997

Attest:

BRUCE LEHMAN

*Attesting Officer*  *Commissioner of Patents and Trademarks*

United States Patent [19]

Iijima

[11] Patent Number: 5,621,600
[45] Date of Patent: Apr. 15, 1997

[54] INDUCTIVE SHORT FINDER

[76] Inventor: Akira Iijima, 20909 Norwalk Bl #24, Lakewood, Calif. 90715

[21] Appl. No.: 189,892

[22] Filed: Feb. 1, 1994

Related U.S. Application Data

[63] Continuation-in-part of Ser. No. 45,941, Apr. 12, 1993, abandoned.

[51] Int. Cl.[6] .................................................. H02H 3/00
[52] U.S. Cl. ............................ 361/93; 361/58; 361/115
[58] Field of Search ............................. 361/93, 80, 81, 361/85, 78, 79, 58, 115; 324/52, 51

[56] References Cited

U.S. PATENT DOCUMENTS 4,518,911  5/1985  Cass ............................................ 324/52

*Primary Examiner*—Jeffrey A. Gaffin
*Assistant Examiner*—Stephen Jackson
*Attorney, Agent, or Firm*—Gerald W. Maliszewski

[57] ABSTRACT

A portable apparatus to test an automobile wiring harness for the location of a short in one of the wires. A transmitter is used to apply a low frequency, low duty cycle, pulsed signal to the wire under test. A receiver, with an inductive sensor, detects magnetic fields generated by the pulsed signal current flow between the transmitter and the short. The receiver generates a humanly discernable signal in response to the detected magnetic field. The operator finds the short by following the detected magnetic field of the signal pulse through the wire under test. By noting the location of a dramatic discontinuity in magnetic field strength, the operator can gauge the location of the short in the wire. The low voltage amplitude, low duty cycle, pulse signal allows the transmitter to be operated with a small battery. The low power signals also provide safety to circuits connected to the wire. The low frequency and power of the pulsed signal minimizes coupling between wires. The substantially contained magnetic field allows the operator of the portable receiver unit to pinpoint the location of the short.

18 Claims, 5 Drawing sheets